(12) United States Patent
Chiu (10) Patent No.: US 10,284,144 B2
(45) Date of Patent: May 7, 2019

(54) AMPLIFIER CIRCUIT OF HIGH RESPONSE SPEED AND RELATED CLAMPING METHOD

(71) Applicant: NOVATEK Microelectronics Corp., Hsin-Chu (TW)

(72) Inventor: Hsiang-Yi Chiu, New Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 36 days.

(21) Appl. No.: 15/725,263

(22) Filed: Oct. 4, 2017

(65) Prior Publication Data

US 2019/0103840 A1 Apr. 4, 2019

(51) Int. Cl.
*H03F 3/45* (2006.01)
*H03F 1/02* (2006.01)
*H03F 1/34* (2006.01)

(52) U.S. Cl.
CPC ........... *H03F 1/0205* (2013.01); *H03F 1/342* (2013.01); *H03F 3/45183* (2013.01); *H03F 2203/45026* (2013.01); *H03F 2203/45102* (2013.01)

(58) Field of Classification Search
CPC .... H03F 1/0205; H03F 1/342; H03F 3/45183; H03F 1/3211; H03F 3/45; H03F 3/45475; H03F 2200/153; H03F 2203/30036; H03F 3/45479; H03F 3/45071; H03F 1/34; H03F 3/4565
USPC .................................................. 330/259, 260
See application file for complete search history.

(56) References Cited

U.S. PATENT DOCUMENTS

| | | | | |
|---|---|---|---|---|
| 3,679,989 A | * | 7/1972 | Thibodeau | H03F 1/52 330/135 |
| 4,161,693 A | * | 7/1979 | Carlson | H03F 3/45479 324/173 |
| 6,037,759 A | * | 3/2000 | Chen | G05F 1/46 323/280 |
| 6,160,450 A | * | 12/2000 | Eschauzier | H03F 1/301 330/253 |
| 6,914,485 B1 | * | 7/2005 | Carroll | H03F 1/3211 330/258 |
| 8,098,094 B2 | * | 1/2012 | Gilbert | H03F 1/302 330/144 |
| 2011/0175583 A1 | * | 7/2011 | Thomas | G05F 1/56 323/280 |

* cited by examiner

*Primary Examiner* — Khanh V Nguyen
(74) *Attorney, Agent, or Firm* — Winston Hsu (57) ABSTRACT

An amplifier circuit includes an input stage, having a positive input end and a negative a negative input end, for generating a pair of differential signals according to a first input voltage received from the positive input end and a second input voltage received from a negative input end; an output stage, coupled to the input stage for generating an output voltage at an output end according to the pair of differential signals; a feedback stage, coupled between the output end and the negative input end; and a clamping unit, coupled between the positive input end and the negative input end for adjusting the second input voltage when the first input voltage is varied so as to clamp a voltage difference between the first input voltage and second input voltage.

20 Claims, 6 Drawing Sheets

AMPLIFIER CIRCUIT OF HIGH RESPONSE SPEED AND RELATED CLAMPING METHOD

BACKGROUND OF THE INVENTION

1. Field of the Invention

The present invention relates to an amplifier circuit and related clamping method, and more particularly, to an amplifier circuit of high response speed and related clamping method.

2. Description of the Prior Art

With development of display resolution, such as full HD or 4K resolution, the charging period for a pixel unit in a display panel keeps being reduced. Because of the reduced charging period, response speeds of basic units (e.g. operational amplifiers, digital-to-analog converters and input front-ends) in driving circuits of the display panel are required to be improved.

In the conventional art, the most effective method of increasing the response time of a basic unit is increasing an operational current of the basic unit. However, increasing the operational current would inevitably raise the power consumption of the driving circuit. Thus, how to increase the response speed of the basic unit without increasing the operational current becomes a topic to be discussed.

SUMMARY OF THE INVENTION

The present disclosure provides an amplifier circuit of high response speed and related clamping method. The amplifier is capable of (but not limited to) solving the above problem.

In an aspect, the present invention provides an amplifier circuit. The amplifier circuit comprises an input stage, having a positive input end and a negative input end, for generating a pair of differential signals according to a first input voltage received from the positive input end and a second input voltage received from a negative input end; an output stage, coupled to the input stage for generating an output voltage at an output end according to the pair of differential signals; a feedback stage, coupled between the output end and the negative input end; and a clamping unit, coupled between the positive input end and the negative input end for adjusting the second input voltage when the first input voltage is varied so as to clamp a voltage difference between the first input voltage and second input voltage.

In another aspect, the present invention provides a clamping method for an amplifier circuit, wherein the amplifier circuit comprises an input stage, having a positive input end and a negative input end respectively receiving a first input voltage and a second input voltage, an output stage, coupled to the input stage for generating an output voltage at an output end according to a pair of differential signals generated by the input stage, and a feedback stage, coupled between the output end and the negative input end, wherein the clamping method comprises when the first input voltage is increased to be greater than the second input voltage and a voltage difference between the first input voltage and second input voltage exceeds a threshold voltage, pulling up the second input voltage such that the voltage difference between the first input voltage and second input voltage does not exceed the threshold voltage; and when the first input voltage is decreased to be lower than the second input voltage and the voltage difference between the first input voltage and second input voltage exceeds the threshold voltage, pulling down the second input voltage such that the voltage difference between the first input voltage and second input voltage does not exceed the threshold voltage.

These and other objectives of the present invention will no doubt become obvious to those of ordinary skill in the art after reading the following detailed description of the preferred embodiment that is illustrated in the various figures and drawings.

DETAILED DESCRIPTION

In the following embodiments of the present invention, amplifier circuits with high response speed are disclosed. Each amplifier circuit adjusts an input voltage of an input stage in the amplifier circuit when another input voltage of the input stage is varied, so as to clamp a voltage difference between the input voltages of the input stage and to adjust an output voltage of the amplifier circuit. The response speed of the amplifier circuit can be increased, therefore. The present invention is particularly shown and described with respect to at least one exemplary embodiment accompanied by drawings. Words utilized for describing connections between two components such as "couple" and "connect" should not be taken as limiting a connection between the two components to be directly coupling or indirectly coupling.

Figure 1:
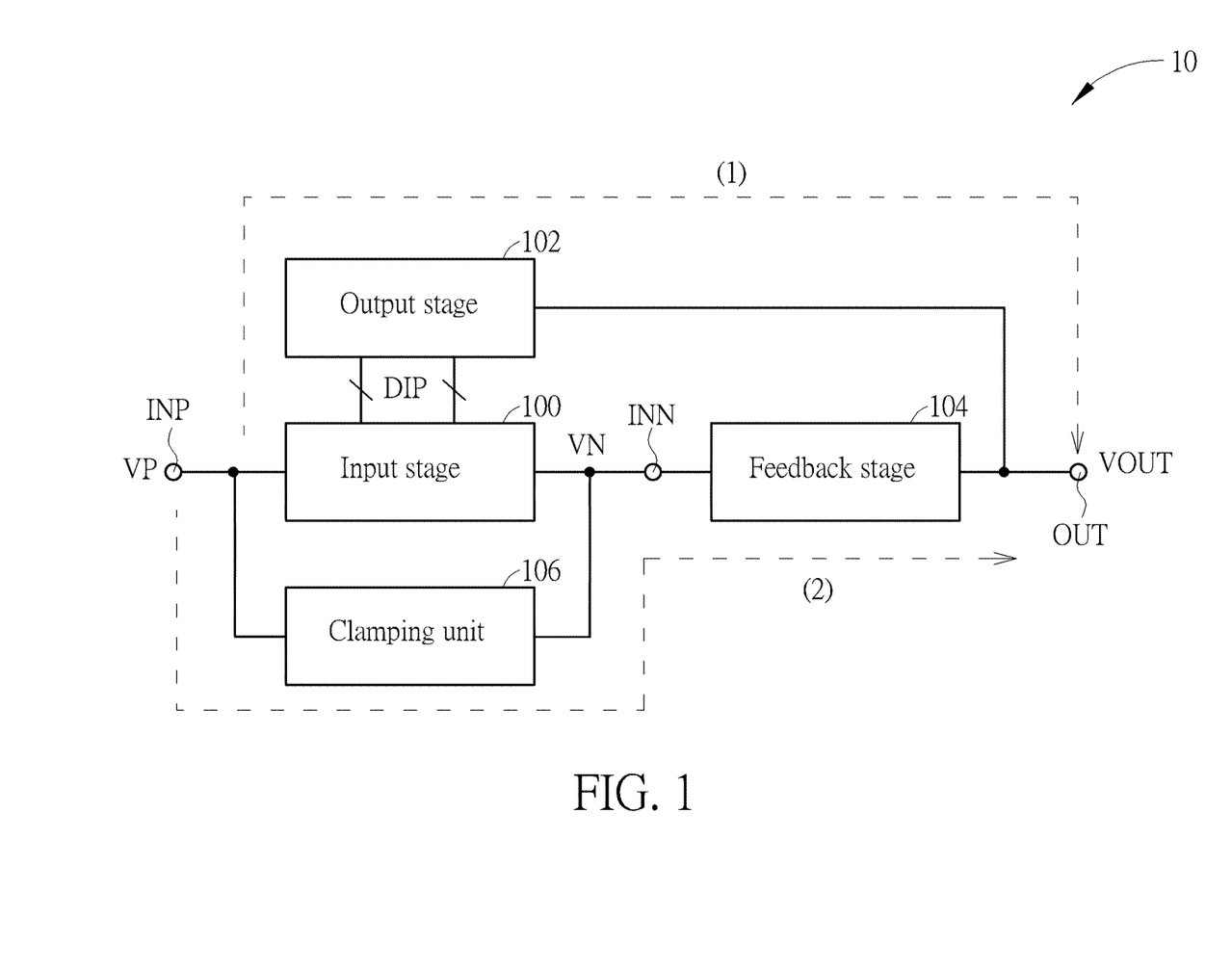
FIG. 1 is a schematic diagram of an amplifier circuit according to an example of the present invention.

Please refer to FIG. 1, which is a schematic diagram of an amplifier circuit 10 according to an example of the present invention. The amplifier circuit 10 may be utilized in a driving circuit (e.g. a driver integrated circuit (IC)) for a display panel of an electronic product, such as a liquid crystal display (LCD), a smart phone and a tablet. As shown in FIG. 1, the amplifier circuit 10 comprises an input stage 100, an output stage 102, a feedback stage 104 and a clamping unit 106. The input stage 100 has a positive input end INP and a negative input end INN and is utilized to provide a differential input pair for generating a pair of differential signals DIP according to a voltage difference VDIFF between an input voltage VP received from the positive input end INP and another input voltage VN received from the negative input end INN. Based on the pair of differential signals DIP, the output stage 102 generates an output voltage VOUT at an output end OUT. The feedback stage 104 is coupled between the output end OUT and the negative input end INN, to feedback the output voltage VOUT to the negative input end INN and to form a negative feedback structure. Because of the negative feedback structure, the output voltage VOUT would follow the input voltage VP. That is, the amplifier circuit 10 may be a voltage follower or a unit gain buffer.

In order to improve a response speed of the amplifier circuit 10 (i.e. increasing the speed of the output voltage VOUT following the positive voltage VP), the amplifier circuit 10 adds the clamping unit 106 to adjust the input voltage VN when the positive voltage VP is varied and to clamp the voltage difference VDIFF. Under such a condition, the input voltage VN would be adjusted when the positive voltage VP is varied and the adjusted input voltage VN changes the output voltage VOUT through the feedback stage 104. As shown in FIG. 1, the input voltage VP affects the output voltage VOUT via not only a first path (1) including the input stage 100 and the output stage 102 but also a second path (2) including the clamping unit 106 and the feedback stage 104. As a result, the speed of the output voltage VOUT following the input voltage VP when the input voltage VP is varied effectively increases.

In an example, the clamping unit 106 adjusts the input voltage VN when an absolute value of the voltage difference VDIFF exceeds a threshold voltage VTH and clamps the voltage difference VDIFF to be equal to the threshold voltage VTH. When the input voltage VP is increased to be greater than the input voltage VN and the absolute value of the voltage difference VDIFF exceeds the threshold voltage VTH (i.e. VP>(VN+VTH)), the clamping unit 106 pulls up the input voltage VN to make the voltage difference VDIFF equal to the threshold voltage VTH; and when the input voltage VP is decreased to be smaller than the input voltage VN and the absolute value of the voltage difference VDIFF exceeds the threshold voltage VTH (i.e. (VP+VTH)<VN), the clamping unit 106 pulls down the input voltage VN to make the voltage difference VDIFF equal to the threshold voltage VTH.

Please note that, because the clamping unit 106 does not consume large power consumption, and the input stage 100, the output stage 102 and the feedback stage 104 remain unchanged when the clamping unit 106 is added, the operational current and the power consumption of the amplifier circuit 10 keep approximated the same. By adding the clamping unit 106, the response speed of the amplifier circuit 10 is improved without significant increasing the operational current of the amplifier circuit 10.

In an example, the clamping units 106 is realized by a plurality of diodes, wherein each diode is coupled between the positive input end INP and the negative input end INN, one of the plurality of diodes has an anode coupled to the negative input end INN and a cathode coupled to the positive input end INP, and another one of the plurality of diodes has an anode coupled to the positive input end INP and a cathode coupled to the negative input end INN.

Figure 2:
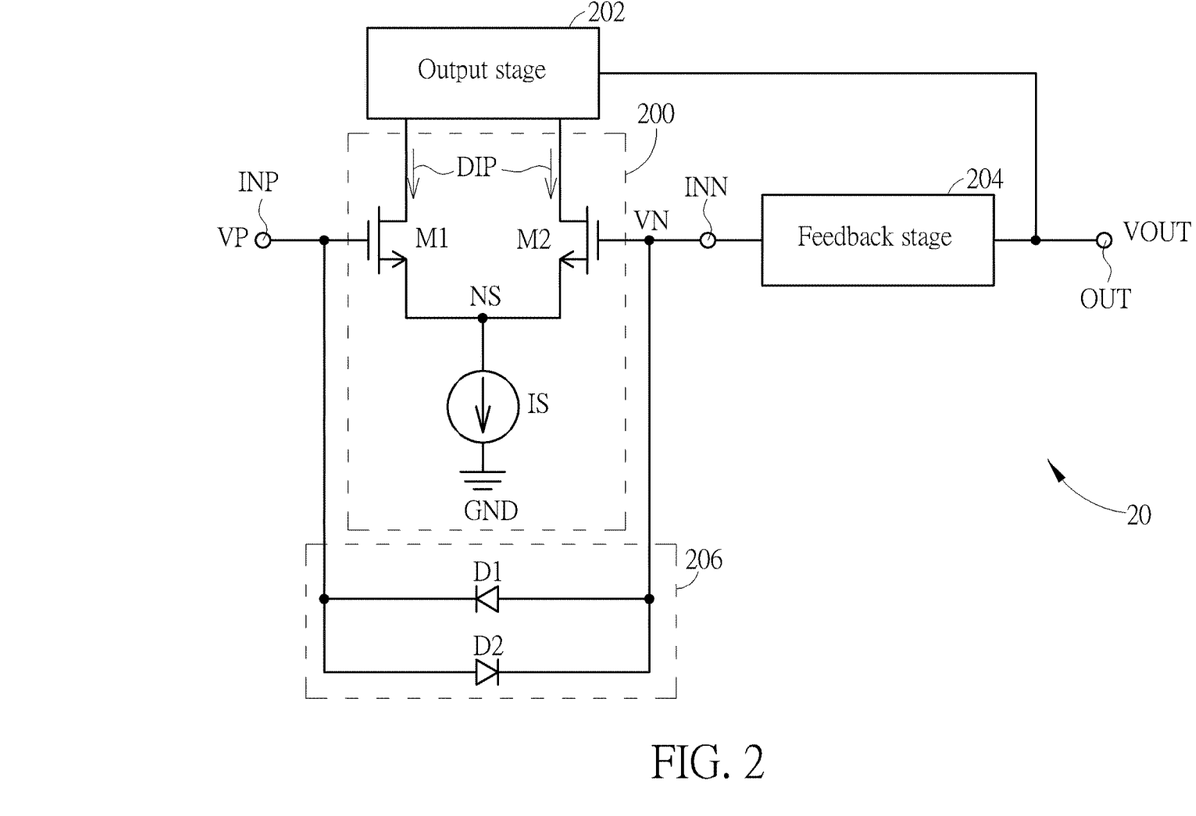
FIG. 2 is a schematic diagram of an amplifier circuit according to another example of the present invention.

Please refer to FIG. 2, which is a schematic diagram of an amplifier circuit 20 according to an example of the present invention, wherein the amplifier circuit 20 is an exemplary embodiment of the amplifier circuit 10 shown in FIG. 1. In FIG. 2, the amplifier circuit 20 comprises an input stage 200, an output stage 202, a feedback stage 204 and a clamping unit 206. The input stage 200 comprises an N-type metal-oxide semiconductor field effect transistor (N-MOSFET, denoted as NMOS hereinafter) M1, an NMOS M2 and a current source IS. The NMOSs M1 and M2 form a differential input pair and generate a pair of differential signals DIP according to the voltage difference VDIFF between the input voltages VP and VN by using the current source IS. The output stage 202 and the feedback stage 204 are similar to the output stage 102 and the feedback stage 104; thus, the description of the output stage 202 and the feedback stage 204 are omitted for brevity.

In the example shown in FIG. 2, the clamping unit 206 comprises diodes D1 and D2. The diode D1 has an anode directly connected to the negative input end INN and a cathode directly connected to the positive input end INP, and the diode D2 has an anode directly connected to the positive input end INP and a cathode directly connected to the negative input end INN. When the input voltage VP is increased to be greater than the input voltage VN and the absolute value of the voltage difference VDIFF exceeds a cut-in voltage $VCI_D$ of the diode D2, the diode D2 is turned on and the input voltage VN is pulled up. When the input voltage VP is decreased to be smaller than the input voltage VN and the absolute value of the voltage difference VDIFF exceeds the cut-in voltage $VCI_D$ of the diode D1, the diode D1 is turned on and the input voltage VN is pulled down. Via the diodes D1 and D2, the voltage difference VDIFF is clamped to be below the cut-in voltage $VCI_D$ of the diodes D1 and D2. In other words, the threshold voltage VTH is the cut-in voltage $VCI_D$ of the diodes D1 and D2 in this example. Via the diodes D1 and D2, the input voltage VN is adjusted when the input voltage VP is varied and accordingly adjusts the output voltage VOUT through the feedback stage 204. The response speed of the amplifier circuit 20 is increased, therefore.

Please note that, the input stage 100 may be realized in different structures according to different applications and designed concepts and is not limited to the structure of the input stage 200 shown in FIG. 2. For example, the input stage 100 may be realized by an input differential pair consisting of P-type metal-oxide semiconductor field effect transistors (P-MOSFETs, denoted as PMOSs hereinafter). Or, the input stage 100 may comprise the input differential pairs of both NMOSs and PMOSs.

In an example, the clamping unit 106 is realized by one or more first diode-connected transistors (i.e. the gate of the transistor is coupled to the drain of the transistor) serially coupled between the positive input end INP and a first node and one or more second diode-connected transistors serially coupled between the negative input end INN and the first node.

Figure 3:
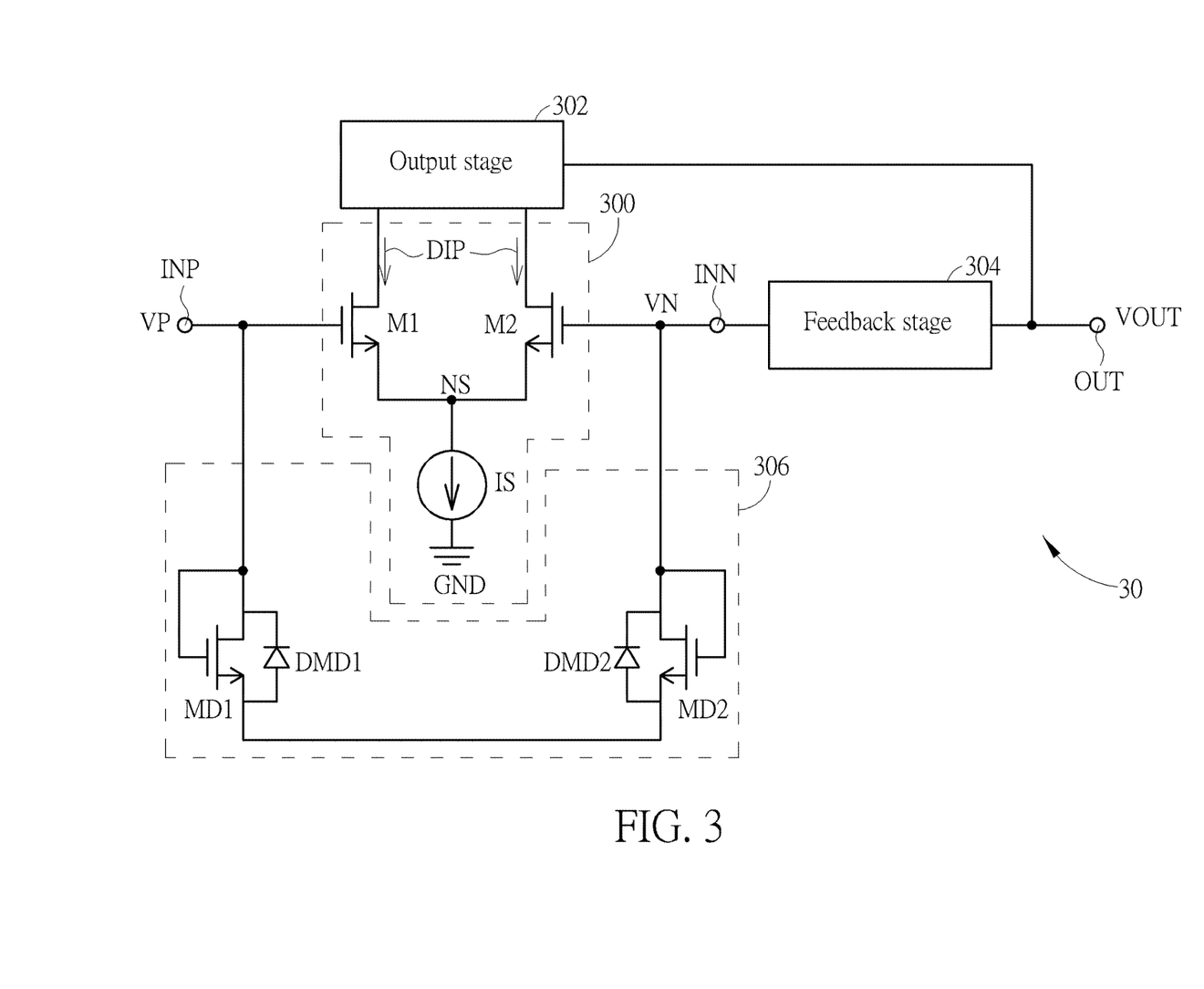
FIG. 3 is a schematic diagram of an amplifier circuit according to another example of the present invention.

Please refer to FIG. 3, which is a schematic diagram of an amplifier circuit 30 according to an example of the present invention, wherein the amplifier circuit 30 is an exemplary embodiment of the amplifier circuit 10 shown in FIG. 1. As shown in FIG. 3, the amplifier circuit 30 comprises an input stage 300, an output stage 302, a feedback stage 304 and a clamping unit 306. The input stage 300, the output stage 302 and the feedback stage 304 are similar to the input stage 200, the output stage 202 and the feedback stage 204; thus, the description of the input stage 300, the output stage 302 and the feedback stage 304 are omitted for brevity.

In FIG. 3, the clamping unit 306 comprises NMOSs MD1 and MD2 which are diode-connected. The drain of the NMOS MD1 is coupled to the positive input end INP, the source of the NMOS MD1 is coupled to the source of the NMOS MD2, and the drain of the NMOS MD2 is coupled to the negative input end INN. When the input voltage VP is increased to be greater than the input voltage VN and the voltage difference VDIFF exceeds a sum of a turn-on voltage $VT_N$ of the NMOS MD1 and a cut-in voltage $VCI_{MD}$ of a parasitic diode DMD2 of the NMOS MD2 (i.e. $VTH=VT_N+VCI_{MD}$), the input voltage VN is pulled up by the input voltage VP and the voltage difference VDIFF is clamped to be $VT_N+VCI_{MD}$. When the input voltage VP is decreased to be smaller than the input voltage VN and the voltage difference VDIFF exceeds the sum of the turn-on voltage $VT_N$ of the NMOS MD2 and the cut-in voltage $VCI_{MD}$ of a parasitic diode DMD1 of the NMOS MD1, the input voltage VN is pulled down by the input voltage VP and the voltage difference VDIFF is clamped to be $VT_N+VCI_{MD}$. Via the diode-connected NMOSs MD1 and MD2 and the parasitic diodes DMD1 and DMD2, the input voltage VN is adjusted when the input voltage VP is varied and accordingly adjusts the output voltage VOUT through the feedback stage 304. The response speed of the amplifier circuit 30 is increased, therefore.

Figure 4:
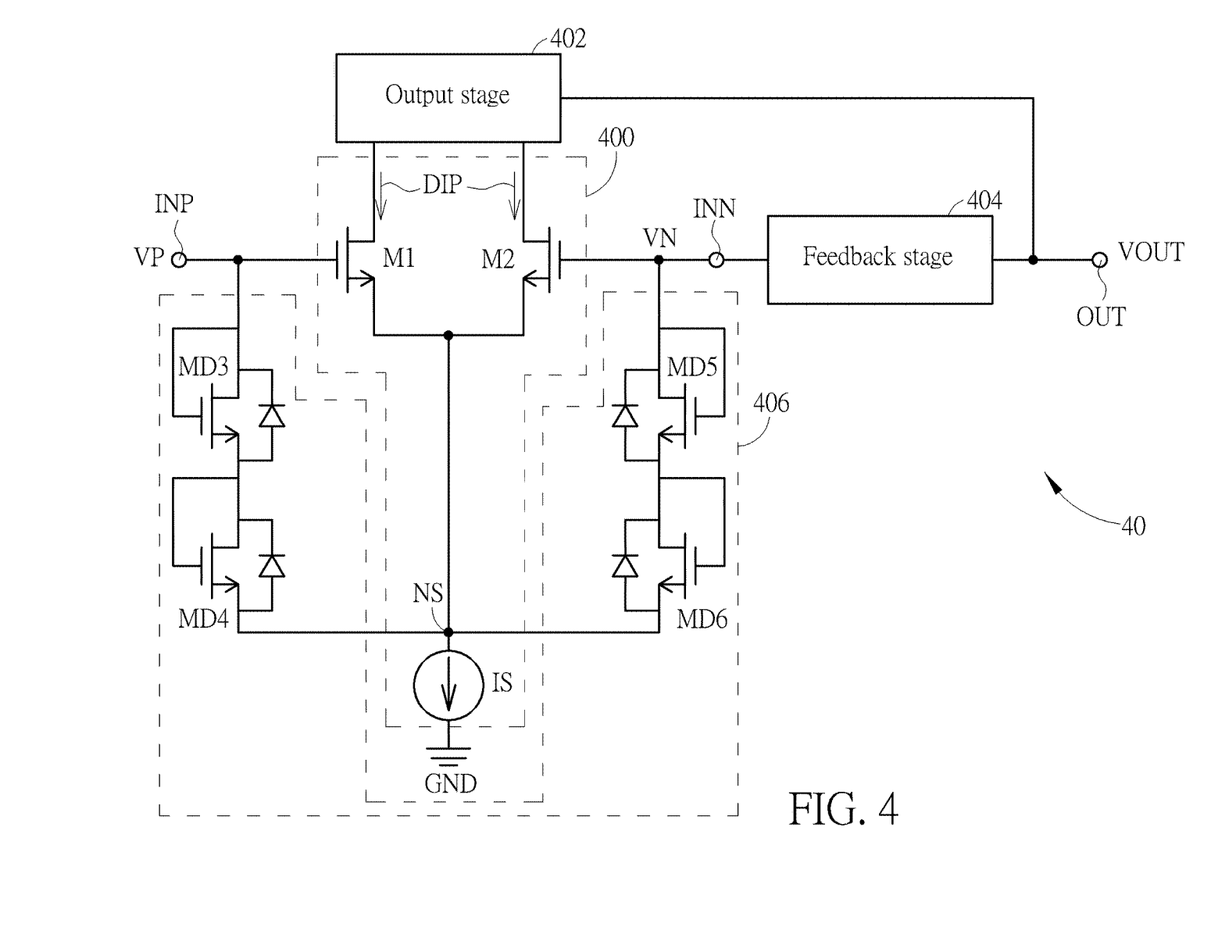
FIG. 4 is a schematic diagram of an amplifier circuit according to another example of the present invention.

Please refer to FIG. 4, which is a schematic diagram of an amplifier circuit 40 according to an example of the present invention, wherein the amplifier circuit 40 is an exemplary embodiment of the amplifier circuit 10 shown in FIG. 1. As shown in FIG. 4, the amplifier circuit 40 comprises an input stage 400, an output stage 402, a feedback stage 404 and a clamping unit 406. The input stage 400, the output stage 402 and the feedback stage 404 are similar to the input stage 200, the output stage 202 and the feedback stage 204; thus, the description of the input stage 400, the output stage 402 and the feedback stage 404 are omitted for brevity.

Similar to the clamping unit 306, the clamping unit 406 consists of a plurality of diode-connected transistors. As shown in FIG. 4, the clamping unit 406 comprises NMOSs MD3, MD4, MD5, and MD6 which are all diode-connected. The drain and the gate of the NMOS MD3 are coupled to the positive input end INP; the source of the NMOS MD3 is coupled to the drain and the source of the NMOS MD4; the source of the NMOS MD4 is coupled to the source of the NMOS MD6; the drain and the gate of the NMOS MD6 are coupled to the source of the NMOS MD5; and the drain and the source of the NMOS MD5 are coupled to the negative input end INN.

Different from the clamping unit 306, the sources of the NMOSs MD4 and MD6 are coupled to a node NS directly coupled to the sources of the NMOSs M1 and M2 and the current source IS in the input stage 400. The operation principles of the clamping unit 406 are similar to those of the clamping unit 306 and are not described herein for brevity.

Please note that, the clamping unit 406 is able to adjust the input voltage VN when the input voltage VP is varied and to clamp the voltage difference VDIFF below the threshold voltage VTH without coupling the sources of the NMOSs MD4 and MD6 to the node NS. Also, the clamping unit 306 is able to achieve the original functions when the sources of the NMOSs MD1 and MD2 are coupled to the node NS coupled to the sources of the NMOSs M1 and M2. In other words, the clamping unit 406 shown in FIG. 4 may disconnect the conducting path from the sources of the NMOSs MD4 and MD6 to the node NS and the clamping unit 306 shown in FIG. 3 may build the conducting path from the sources of the NMOSs MD1 and MD2 to the node NS according to different applications and design concepts.

In an example, the clamping circuit 106 may comprise two signal paths SP1 and SP2. The signal path SP1 is coupled between a voltage source providing a reference voltage REF1 and the input voltage VN and has a control node CSP1 coupled to the positive input end INP for controlling an equivalent resistance ER1 of the signal path SP1 according to the input voltage VP. The signal path SP2 is coupled between a voltage source providing a reference voltage REF2 and the input voltage VN and has a control node CSP2 coupled to the positive input end INP for controlling an equivalent resistance ER2 of the signal path SP2 according to the input voltage VP. When the input voltage VP is increased, the equivalent resistance ER1 is decreased to pull up the input voltage VN, and when the input voltage VP is decreased, the equivalent resistance ER2 is decreased to pull down the input voltage VN. As a result, the input voltage VN is adjusted when the input voltage VP is varied. The output voltage VOUT is accordingly adjusted and the response speed of the amplifier circuit 106 is therefore increased.

Figure 5:
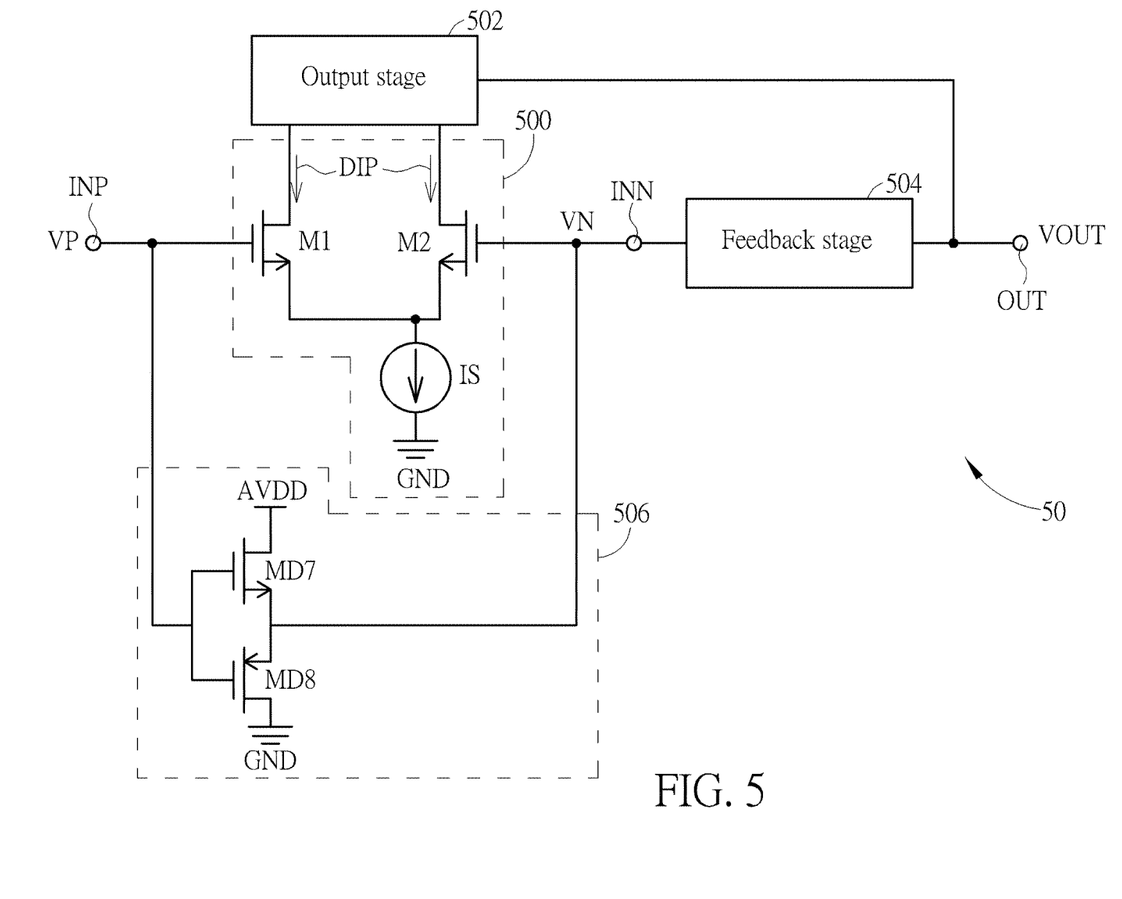
FIG. 5 is a schematic diagram of an amplifier circuit according to another example of the present invention.

As to the example of the clamping unit with 2 signal paths SP1 and SP2, please refer to FIG. 5, which is a schematic diagram of an amplifier circuit 50 according to an example of the present invention, wherein the amplifier circuit 50 is an exemplary embodiment of the amplifier circuit 10 shown in FIG. 1. As shown in FIG. 5, the amplifier circuit 50 comprises an input stage 500, an output stage 502, a feedback stage 504 and a clamping unit 506. The input stage 500, the output stage 502 and the feedback stage 504 are similar to the input stage 200, the output stage 202 and the feedback stage 204; thus, the description of the input stage 500, the output stage 502 and the feedback stage 504 are omitted for brevity.

In the example shown in FIG. 5, the clamping unit 506 comprises a NMOS MD7 and a PMOS MD8. The drain, gate and source of the NMOS MD7 are coupled to a voltage source providing a reference voltage AVDD, the positive input end INP, and the negative input end INN, respectively, and the drain, gate and source of the PMOS MD8 are coupled to the ground providing a grounding voltage GND, the positive input end INP, and the negative input end INN. Note that, the voltage source providing the voltage AVDD and the ground may be the voltage source and the grounding node of the output stage 502. In an example, the voltage AVDD is the maximum voltage of the amplifier circuit 50 and the ground voltage GND is the minimum voltage of the amplifier circuit 50. When the input voltage VP is increased to exceed the input voltage VN by the turn-on voltage $VT_N$ of the NMOS MD7 (i.e. VP>(VN+$VT_N$)), the NMOS MD7 conducts the signal path between the voltage source of the voltage AVDD and the negative input end INN to pull up the input voltage VN. When the input voltage VP is decreased to be smaller than the input voltage VN by a threshold voltage $VT_P$ of the PMOS MD7 (i.e. VN>(VP+$VT_P$)), the PMOS MD8 conducts the signal path between the ground and the negative input end to pull down the input voltage VN. Under such a condition, the voltage difference VDIFF is clamped within the turn-on voltages $VT_N$–$VT_P$. Via the NMOS MD7 and the PMOS MD8, the input voltage VN is adjusted when the input voltage VP varies and accordingly adjusts the output voltage VOUT through the feedback stage 504. The response speed of the amplifier circuit 50 is increased, therefore.

Figure 6:
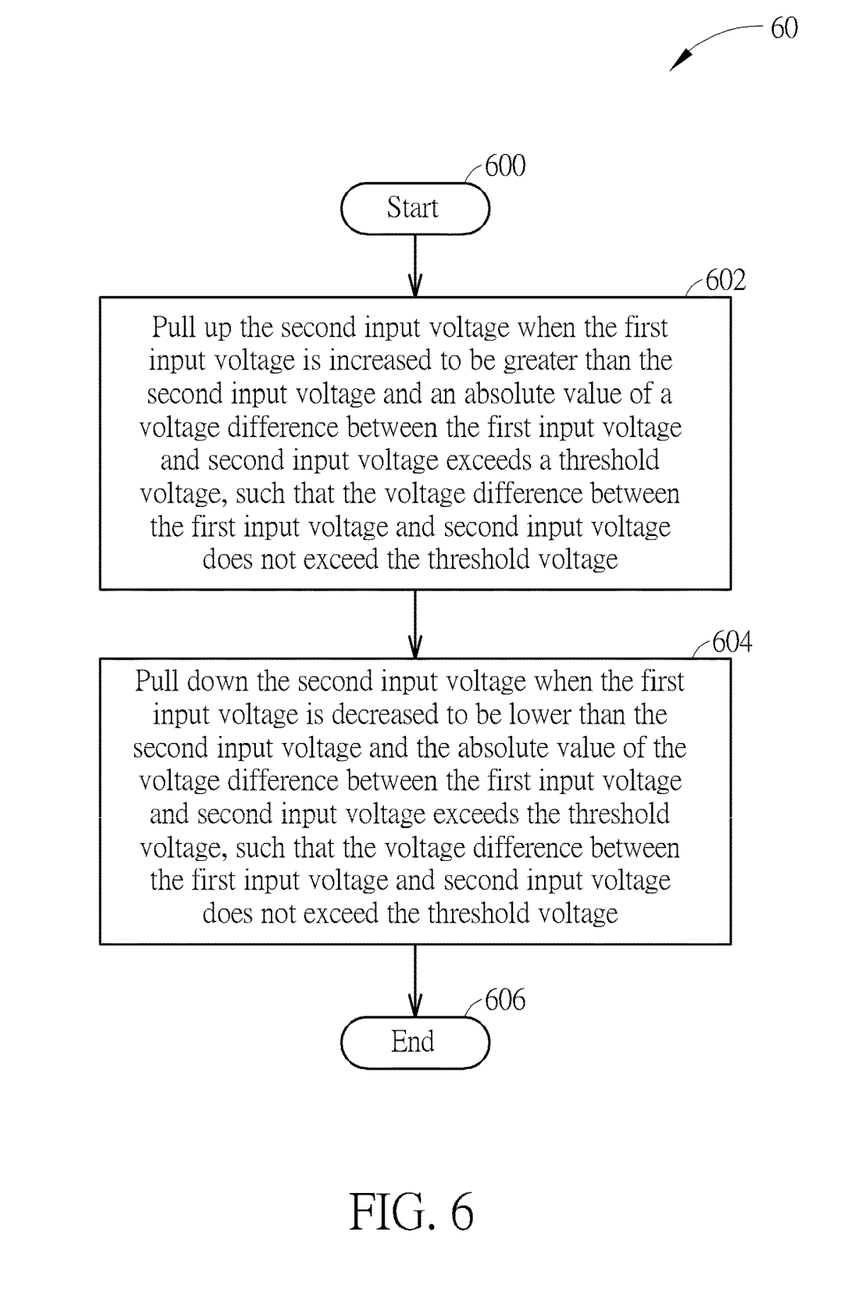
FIG. 6 is a flowchart of a progress according to an example of the present invention.

The method of the above clamping units adjusting the input voltage VN when the input voltage VP varies can be summarized into a progress 60 shown in FIG. 6. The progress 60 can be utilized in an amplifier circuit comprising an input stage for providing a differential input pair having a positive input end and a negative a negative input end respectively receiving a first input voltage and a second input voltage, an output stage, coupled to the input stage for generating an output voltage at an output end according to a pair of differential signals generated by the differential input pair, and a feedback stage, coupled between the output end and the negative input end. The progress 60 comprises the following steps:

Step 600: Start.

Step 602: Pull up the second input voltage when the first input voltage is increased to be greater than the second input voltage and an absolute value of a voltage difference between the first input voltage and second input voltage exceeds a threshold voltage, such that the voltage difference between the first input voltage and second input voltage does not exceed the threshold voltage.

Step 604: Pull down the second input voltage when the first input voltage is decreased to be lower than the second input voltage and the absolute value of the voltage difference between the first input voltage and second input voltage exceeds the threshold voltage, such that the voltage difference between the first input voltage and second input voltage does not exceed the threshold voltage.

Step 606: End.

The detailed operations of the progress 60 can (but not limitedly) refer to the above descriptions of amplifier circuits 10, 20, 30, 40 and 50, and are not narrated herein for brevity.

To sum up, the clamping unit of the embodiments can adjust the second input voltage of the negative input end when the first input voltage of the positive input end in the amplifier circuit is varied, to clamp the voltage difference between the second input voltage and the first input voltage. Under such a condition, the response speed of the amplifier circuit can be effectively improved without significantly increasing the operational current and the power consumption of the amplifier circuit.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
   an input stage, having a positive input end and a negative a negative input end, for generating a pair of differential signals according to a first input voltage received from the positive input end and a second input voltage received from a negative input end;
   an output stage, coupled to the input stage for generating an output voltage at an output end according to the pair of differential signals;
   a feedback stage, coupled between the output end and the negative input end; and
   a clamping unit, coupled between the positive input end and the negative input end for adjusting the second input voltage when the first input voltage is varied so as to clamp a voltage difference between the first input voltage and second input voltage.

2. The amplifier circuit of claim 1, wherein the clamping unit adjusts the second input voltage to follow the variation in the first input voltage such that the voltage difference between the first input voltage and second input voltage is clamped to be below a threshold voltage.

3. The amplifier circuit of claim 2, wherein the clamping unit adjusts the second input voltage when an absolute value of the voltage difference between the first input voltage and second input voltage exceeds the threshold voltage.

4. The amplifier circuit of claim 3, wherein the clamping unit increases the second input voltage when the absolute value of the voltage difference between the first input voltage and second input voltage exceeds the threshold voltage and the first input voltage is increased to be greater than the second input voltage.

5. The amplifier circuit of claim 3, wherein the clamping unit decreases the second input voltage when the absolute value of the voltage difference between the first input voltage and second input voltage exceeds the threshold voltage and the first input voltage is decreased to be smaller than the second input voltage.

6. The amplifier circuit of claim 1, wherein the clamping unit comprises a plurality of diodes, each coupled between the negative input end and the positive input end, wherein a first diode of the plurality of diodes has an anode coupled to the negative input end and a cathode coupled to the positive input end and a second diode of the plurality of diode has an anode coupled to the positive input end and a cathode coupled to the negative input end.

7. The amplifier circuit of claim 1, wherein the clamping unit comprises:
   a first diode, comprising an anode directly connected to the negative input end and a cathode directly to the positive input end; and
   a second diode, comprising an anode directly connected to the positive input end and a cathode directly connected to the negative input end.

8. The amplifier circuit of claim 1, wherein the clamping unit comprises:
   one or more first diode-connected transistors, serially coupled between the positive input end and a first node; and
   one or more second diode-connected transistors, serially coupled between the negative input end and the first node.

9. The amplifier circuit of claim 8, wherein the input stage has an input differential pair coupled to the output stage and coupled to a current source via a second node, and wherein the first node is further coupled to the second node.

10. The amplifier circuit of claim 8, wherein the input stage has an input differential pair coupled to the output stage and coupled to a current source via a second node, and wherein the first node is not coupled to the second node.

11. The amplifier circuit of claim 1, wherein the clamping unit comprises:
a first transistor, comprising a gate coupled to the positive input end, a drain coupled to the positive input end and a source coupled to a first node; and
a second transistor, comprising a gate coupled to the negative input end, a drain coupled to the negative input end and a source coupled to the first node.

12. The amplifier circuit of claim 1, wherein the clamping unit comprises:
a first transistor, comprising a gate coupled to the positive input end, a drain coupled to the positive input end and a source coupled to a first node;
a second transistor, comprising a gate coupled to the first node, a drain coupled to the first node and a source coupled to a second node; and
a third transistor, comprising a gate coupled to the negative input end, a drain coupled to the negative input end and a source coupled to a third node; and
a fourth transistor, comprising a gate coupled to the third node, a drain coupled to the third node and a source coupled to the second node;
wherein the second node is coupled to sources of an input differential pair in the input stage.

13. The amplifier circuit of claim 1, wherein the clamping unit comprises:
a first signal path coupled between a first reference voltage and the negative input end, having a first control node coupled to the positive input end for controlling a first equivalent resistance of the first signal path according to the first input voltage; and
a second signal path coupled between a second reference voltage and the negative input end, having a second control node coupled to the positive input end for controlling a second equivalent resistance of the second signal path according to the first input voltage.

14. The amplifier circuit of claim 13, wherein when the first input voltage is increased, the first equivalent resistance is decreased to pull up the second input voltage, and when the first input voltage is decreased, the second equivalent resistance is decreased to pull down the second input voltage.

15. The amplifier circuit of claim 13, wherein the clamping unit comprises:
a first transistor, comprising a gate coupled to the positive input end, a drain coupled to a voltage source and a source coupled to the negative input end; and
a second transistor, comprising a gate coupled to the positive input end, a drain coupled to ground and a source coupled to the negative input end.

16. The amplifier circuit of claim 1, wherein neither the positive input end nor the negative input end is coupled to a ground terminal or a fixed voltage.

17. A clamping method for an amplifier circuit, wherein the amplifier circuit comprising an input stage, having a positive input end and a negative a negative input end respectively receiving a first input voltage and a second input voltage, an output stage, coupled to the input stage for generating an output voltage at an output end according to the a pair of differential signals generated by the input stage, and a feedback stage, coupled between the output end and the negative input end, wherein the clamping method comprises:
when the first input voltage is increased to be greater than the second input voltage and an absolute value of a voltage difference between the first input voltage and second input voltage exceeds a threshold voltage, pulling up the second input voltage such that the voltage difference between the first input voltage and second input voltage does not exceed the threshold voltage; and
when the first input voltage is decreased to be lower than the second input voltage and the absolute value of the voltage difference between the first input voltage and second input voltage exceeds the threshold voltage, pulling down the second input voltage such that the voltage difference between the first input voltage and second input voltage does not exceed the threshold voltage.

18. An amplifier circuit, comprising:
an input stage, having a positive input end and a negative a negative input end, for generating a pair of differential signals according to a first input voltage received from the positive input end and a second input voltage received from a negative input end;
an output stage, coupled to the input stage for generating an output voltage at an output end according to the pair of differential signals;
a feedback stage, coupled between the output end and the negative input end; and
a clamping unit, comprising:
a first diode, comprising an anode directly connected to the negative input end and a cathode directly to the positive input end; and
a second diode, comprising an anode directly connected to the positive input end and a cathode directly connected to the negative input end;
wherein neither the positive input end nor the negative input end is coupled to a ground terminal or a fixed voltage.

19. An amplifier circuit, comprising:
an input stage, having a positive input end and a negative a negative input end, for generating a pair of differential signals according to a first input voltage received from the positive input end and a second input voltage received from a negative input end;
an output stage, coupled to the input stage for generating an output voltage at an output end according to the pair of differential signals;
a feedback stage, coupled between the output end and the negative input end; and
a clamping unit, comprising:
one or more first diode-connected transistors, serially coupled between the positive input end and a first node; and
one or more second diode-connected transistors, serially coupled between the negative input end and the first node;
wherein neither the positive input end nor the negative input end is coupled to a ground terminal or a fixed voltage.

20. An amplifier circuit, comprising:
an input stage, having a positive input end and a negative a negative input end, for generating a pair of differential signals according to a first input voltage received from the positive input end and a second input voltage received from a negative input end;
an output stage, coupled to the input stage for generating an output voltage at an output end according to the pair of differential signals;
a feedback stage, coupled between the output end and the negative input end; and a clamping unit, comprising:
  a first transistor, comprising a gate coupled to the positive input end, a drain coupled to the positive input end and a source coupled to a first node; and
  a second transistor, comprising a gate coupled to the negative input end, a drain coupled to the negative input end and a source coupled to the first node;
wherein neither the positive input end nor the negative input end is coupled to a ground terminal or a fixed voltage.

* * * * *